US009255417B2

(12) United States Patent
Bernard

(10) Patent No.: US 9,255,417 B2
(45) Date of Patent: Feb. 9, 2016

(54) INDEPENDENT AISLE CONTAINMENT SYSTEM

(71) Applicant: Panduit Corp., Tinley Park, IL (US)

(72) Inventor: William A. Bernard, Darien, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/638,483

(22) Filed: Mar. 4, 2015

(65) Prior Publication Data
US 2015/0259938 A1    Sep. 17, 2015

Related U.S. Application Data

(60) Provisional application No. 61/951,779, filed on Mar. 12, 2014.

(51) Int. Cl.
| H05K 7/20 | (2006.01) |
| E04H 1/00 | (2006.01) |
| E04F 19/08 | (2006.01) |
| A47B 87/00 | (2006.01) |

(52) U.S. Cl.
CPC .............. *E04H 1/005* (2013.01); *A47B 87/007* (2013.01); *E04F 19/08* (2013.01); *H05K 7/20745* (2013.01)

(58) Field of Classification Search
CPC ... H05K 5/0213; H05K 5/0204; H05K 5/023; H05K 7/1485; H05K 7/1488; H05K 7/1489; H05K 7/20415; E06B 3/42; E06B 3/46; E04B 2/827
USPC ............... 52/36.2, 173.1, 29, 64, 79.1, 243.1; 454/184; 49/404; 312/312
See application file for complete search history.

(56) References Cited

U.S. PATENT DOCUMENTS

| 3,760,535 A | 9/1973 | Trulaske |
| 3,805,450 A | 4/1974 | Forcina |
| 3,978,617 A | 9/1976 | Eventoff |

(Continued)

FOREIGN PATENT DOCUMENTS

| WO | 2010105618 A1 | 9/2010 |
| WO | 2013166708 A1 | 11/2013 |

OTHER PUBLICATIONS

IBM's Inter-Rack Flow Seperator to Prevent Computer Rack Hot Exhaust Air Entry Into Cold Region at Rack Inlet of Computer Data Center Facilities; (an IP.com Prior Art Database Technical Disclosure); 5 pages; Jun. 20, 2006.

(Continued)

*Primary Examiner* — Joshua J Michener
*Assistant Examiner* — Kyle Walraed-Sullivan
(74) *Attorney, Agent, or Firm* — Christopher S. Clancy; Aimee E. McVady

(57) ABSTRACT

An aisle containment system is disclosed. The aisle containment system includes a frame defined by wall beams, header frames, and a plurality of posts secured to the wall beams and header frames. The header frames extend the width of the frame and the wall beams extend the length of the frame. A plurality of blanking panels extend from the floor to one of the wall beams. The plurality of blanking panels have a top, a bottom, a first side and a second side. Vertical stiffeners are positioned along at least one of the first side and the second side of each blanking panel. The blanking panels overlap adjacent blanking panels along the length of the frame. The blanking panels are laterally adjusted to fill openings in the aisle containment system.

18 Claims, 18 Drawing Sheets

(56) References Cited

U.S. PATENT DOCUMENTS

| | | | |
|---|---|---|---|
| 4,126,912 A | | 11/1978 | Johnson |
| 4,641,461 A | | 2/1987 | Niekrasz et al. |
| 4,656,781 A | | 4/1987 | Niekrasz et al. |
| 5,247,763 A | * | 9/1993 | Hein .................. E05F 1/16 49/123 |
| 5,351,442 A | | 10/1994 | Gingras |
| 5,577,348 A | * | 11/1996 | Keller ................. E05B 2/827 160/40 |
| 6,360,487 B1 | | 3/2002 | Kern et al. |
| 7,046,514 B2 | * | 5/2006 | Fink .................. H05K 7/20 165/121 |
| 7,686,405 B2 | | 3/2010 | Trulaske, Sr. et al. |
| 7,841,199 B2 | | 11/2010 | VanGilder et al. |
| 7,986,526 B1 | * | 7/2011 | Howard ............. H05K 7/1488 181/200 |
| 7,992,402 B2 | | 8/2011 | VanGilder et al. |
| 8,072,780 B1 | | 12/2011 | Roy |
| 8,156,753 B2 | | 4/2012 | VanGilder et al. |
| 8,180,495 B1 | | 5/2012 | Roy |
| 8,523,643 B1 | | 9/2013 | Roy |
| 8,857,120 B2 | | 10/2014 | Marrs et al. |
| 2002/0023392 A1 | * | 2/2002 | Bischof ............. E05D 15/0608 52/64 |
| 2007/0173189 A1 | * | 7/2007 | Lewis ............... H05K 7/20009 454/184 |
| 2008/0180908 A1 | * | 7/2008 | Wexler .............. H05K 7/20745 361/690 |
| 2009/0129015 A1 | * | 5/2009 | Nobile .............. H05K 7/20745 361/692 |
| 2009/0241445 A1 | * | 10/2009 | Sprague ............. E04B 2/827 52/243.1 |
| 2009/0277605 A1 | * | 11/2009 | VanGilder .......... H05K 7/20745 165/67 |
| 2010/0144265 A1 | * | 6/2010 | Bednarcik .......... H05K 7/20745 454/184 |
| 2011/0000138 A1 | * | 1/2011 | Stoutenborough ....... E05B 5/00 49/449 |
| 2011/0108207 A1 | | 5/2011 | Mainers et al. |
| 2011/0175505 A1 | * | 7/2011 | Linhares, Jr. ...... H05K 7/20736 312/236 |
| 2011/0271610 A1 | | 11/2011 | Cottuli et al. |
| 2011/0290553 A1 | * | 12/2011 | Behrens ............. H05K 7/1488 174/547 |
| 2011/0300788 A1 | * | 12/2011 | Caveney ............ H05K 7/20736 454/184 |
| 2012/0112612 A1 | * | 5/2012 | Krietzman .......... H05K 7/20745 312/236 |
| 2013/0061624 A1 | * | 3/2013 | Zwinkels ........... H05K 7/20745 62/259.4 |
| 2013/0149954 A1 | | 6/2013 | North et al. |
| 2013/0160271 A1 | | 6/2013 | Krietzman et al. |
| 2013/0165035 A1 | * | 6/2013 | Krietzman .......... H05K 5/0213 454/184 |
| 2013/0210335 A1 | * | 8/2013 | Krietzman .......... H05K 5/0213 454/184 |
| 2013/0276389 A1 | * | 10/2013 | Marrs ................ A62C 35/00 52/173.1 |

OTHER PUBLICATIONS

Simplex™ Isolation Systems' AirblockV Data Center Systems Product Bulletin on Expandable Filler Panels; www.simplexstripdoors.com/pdf/expandablepanelsheet.pdf; 2 pages; Jan. 1, 2011.

* cited by examiner

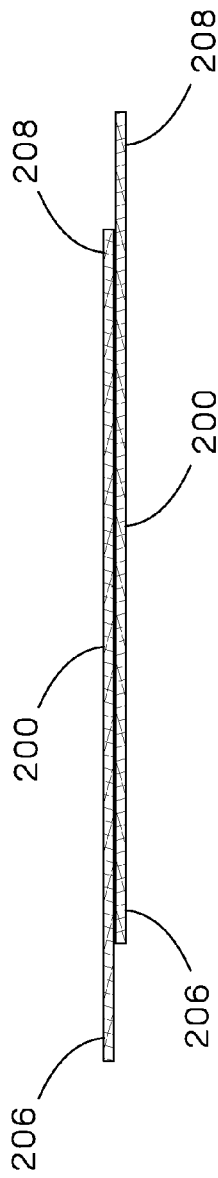
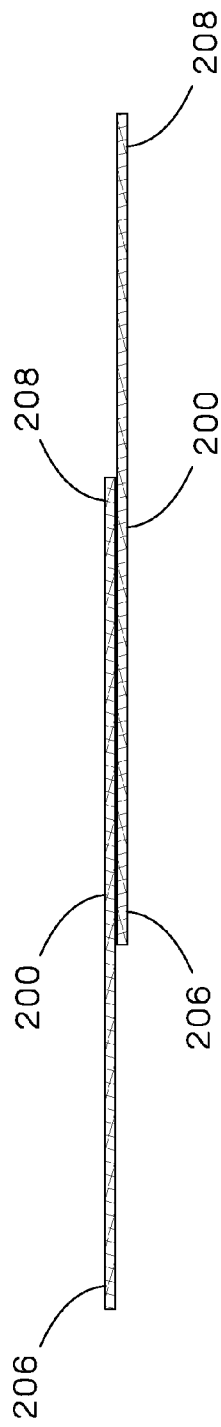
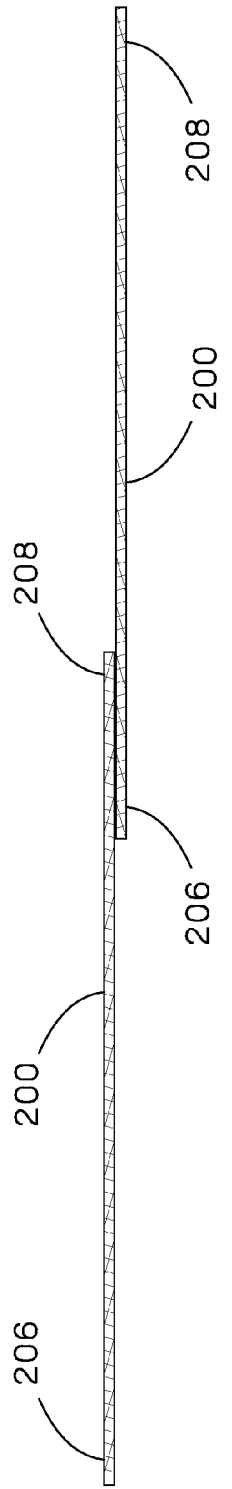

INDEPENDENT AISLE CONTAINMENT SYSTEM

CROSS-REFERENCE TO RELATED APPLICATIONS

This application claims priority to U.S. Provisional Application No. 61/951,779, filed Mar. 12, 2014, the subject matter of which is hereby incorporated by reference in its entirety.

BACKGROUND OF THE INVENTION

The present invention relates to aisle containment systems, and more particularly to an independent aisle containment system with adjustable blanking panels.

SUMMARY OF THE INVENTION

The present invention is directed to an aisle containment system with adjustable blanking panels. The aisle containment system includes a frame defined by wall beams, header frames, and a plurality of posts secured to the wall beams and header frames. The header frames extend the width of the frame and the wall beams extend the length of the frame. A plurality of blanking panels extend from the floor to one of the wall beams. The blanking panels have a top, a bottom, a first side and a second side. Vertical stiffeners are positioned along at least one of the first side and the second side of each blanking panel. Each blanking panel overlaps adjacent blanking panels along the length of the frame. The blanking panels are laterally adjusted, as necessary, to fill openings in the aisle containment system.

The aisle containment system may also include a plurality of cabinets positioned within the frame. The blanking panels are positioned adjacent the cabinets for filling openings in the aisle containment system.

The aisle containment system may also include a plurality of adjustable above cabinet blanking panels. The above cabinet blanking panels are installed above the plurality of cabinets for filling any openings between the wall beams and the cabinets.

BRIEF DESCRIPTION OF THE DRAWINGS

FIG. 17A is a cross sectional view of the above cabinet blanking panels of FIG. 14 taken along line 17-17 adjusted to illustrate a minimum width.

FIG. 17B is a cross sectional view of the above cabinet blanking panels of FIG. 14 taken along line 17-17.

FIG. 17C is a cross sectional view of the above cabinet blanking panels of FIG. 14 taken along line 17-17 adjusted to illustrate a maximum width.

DETAILED DESCRIPTION

The present invention is directed to an independent aisle containment system. The independent aisle containment system separates hot and cold air within a data center. The independent aisle containment system is self-supporting which enables cabinets to be easily added or removed from the aisle within a data center without disturbing the structure of the containment system.

FIGS. 1-17 illustrate the independent aisle containment system 20 used with a cold aisle configuration. The containment system 20 of the present invention includes a plurality of cabinets 50, 60, 70, and 80 that vary in height, width and depth. As discussed below, the height of the frame is chosen based on the tallest cabinet intended to be installed in the containment system. Adjustable blanking panels are positioned adjacent to cabinets and above cabinets to fill any gaps or openings in the containment system.

Figure 1:
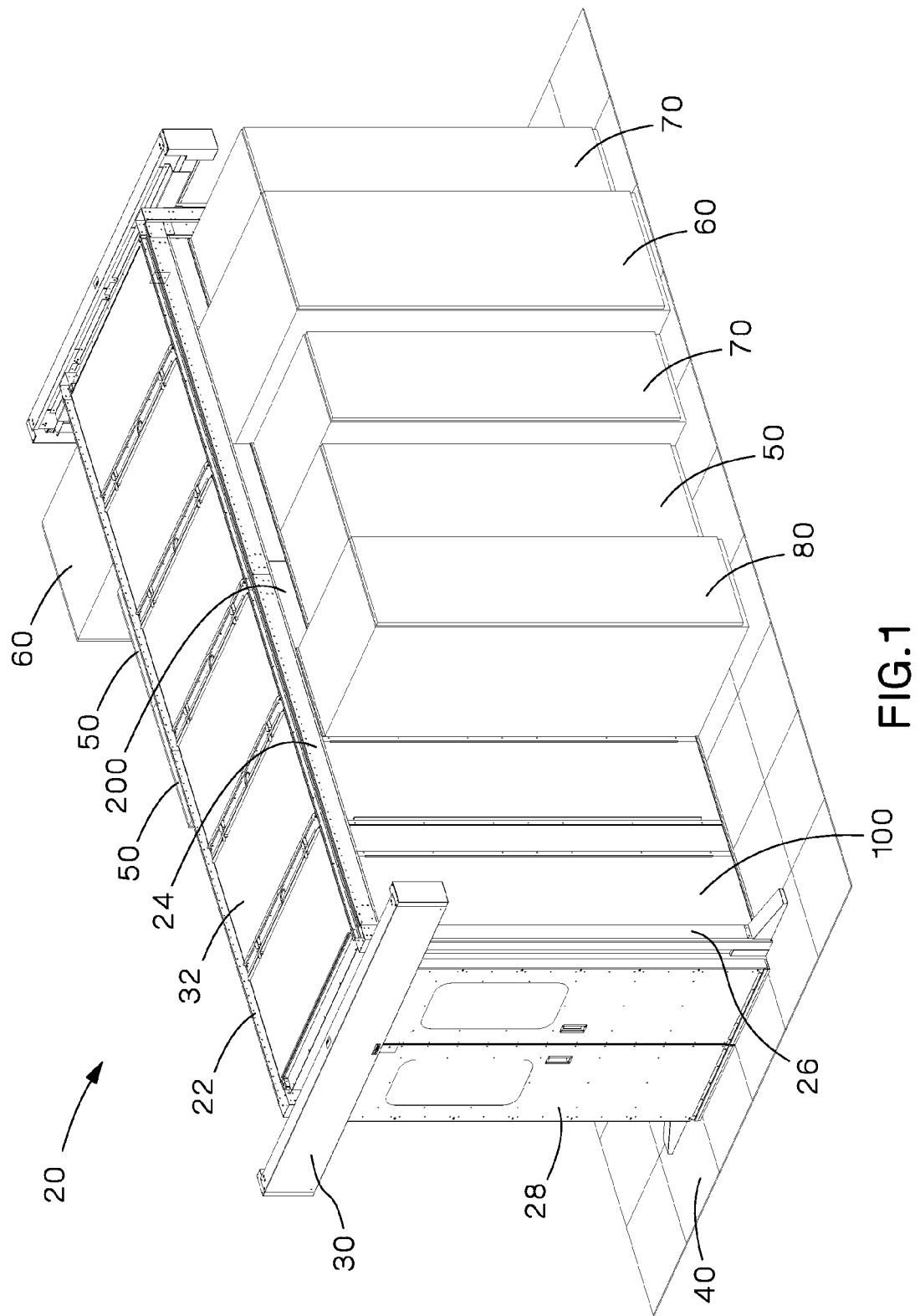
FIG. 1 is a perspective view of the independent aisle containment system of the present invention.
Figure 2:
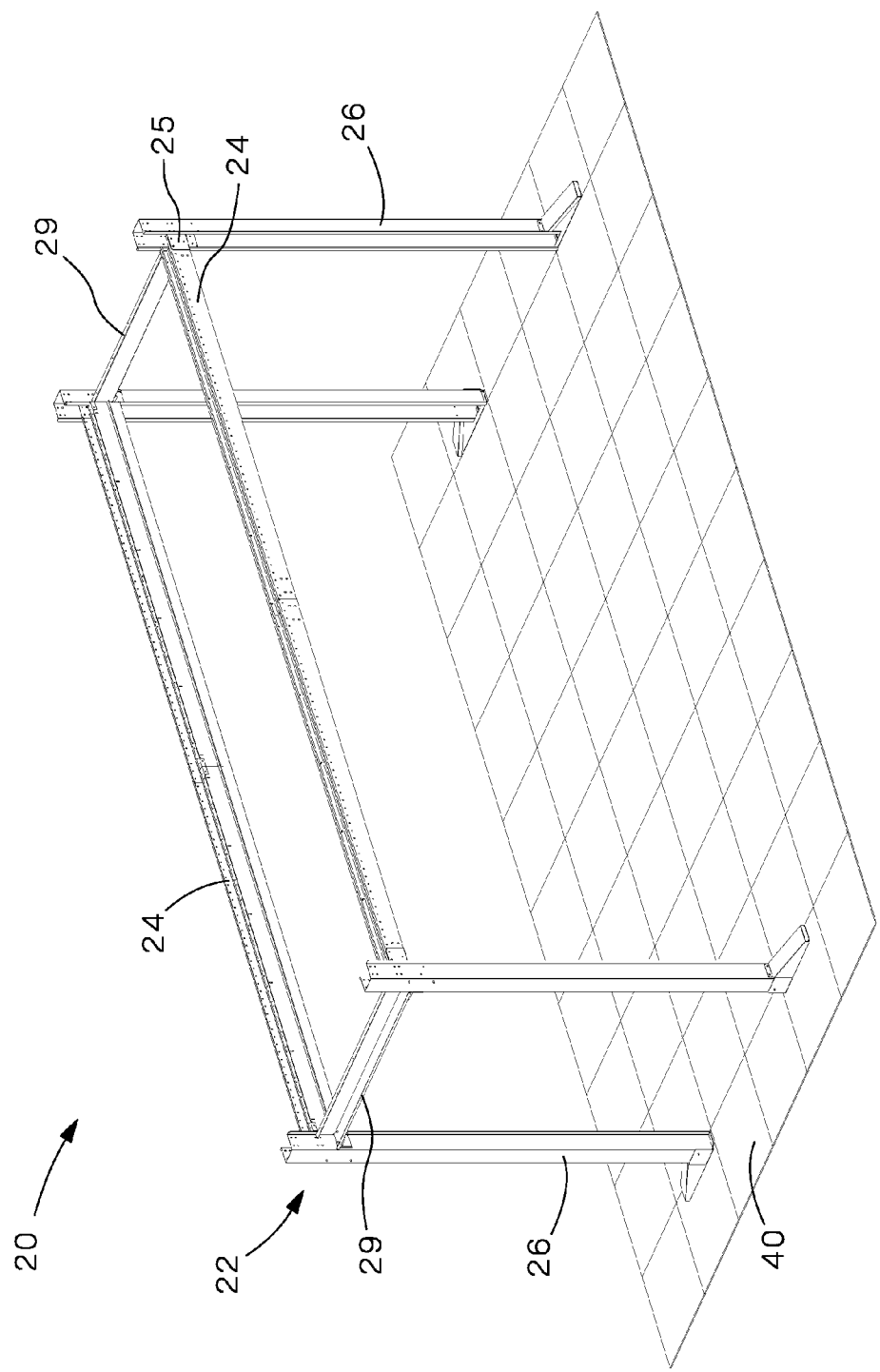
FIG. 2 is a perspective view of the frame of the aisle containment system of FIG. 1.
Figure 3:
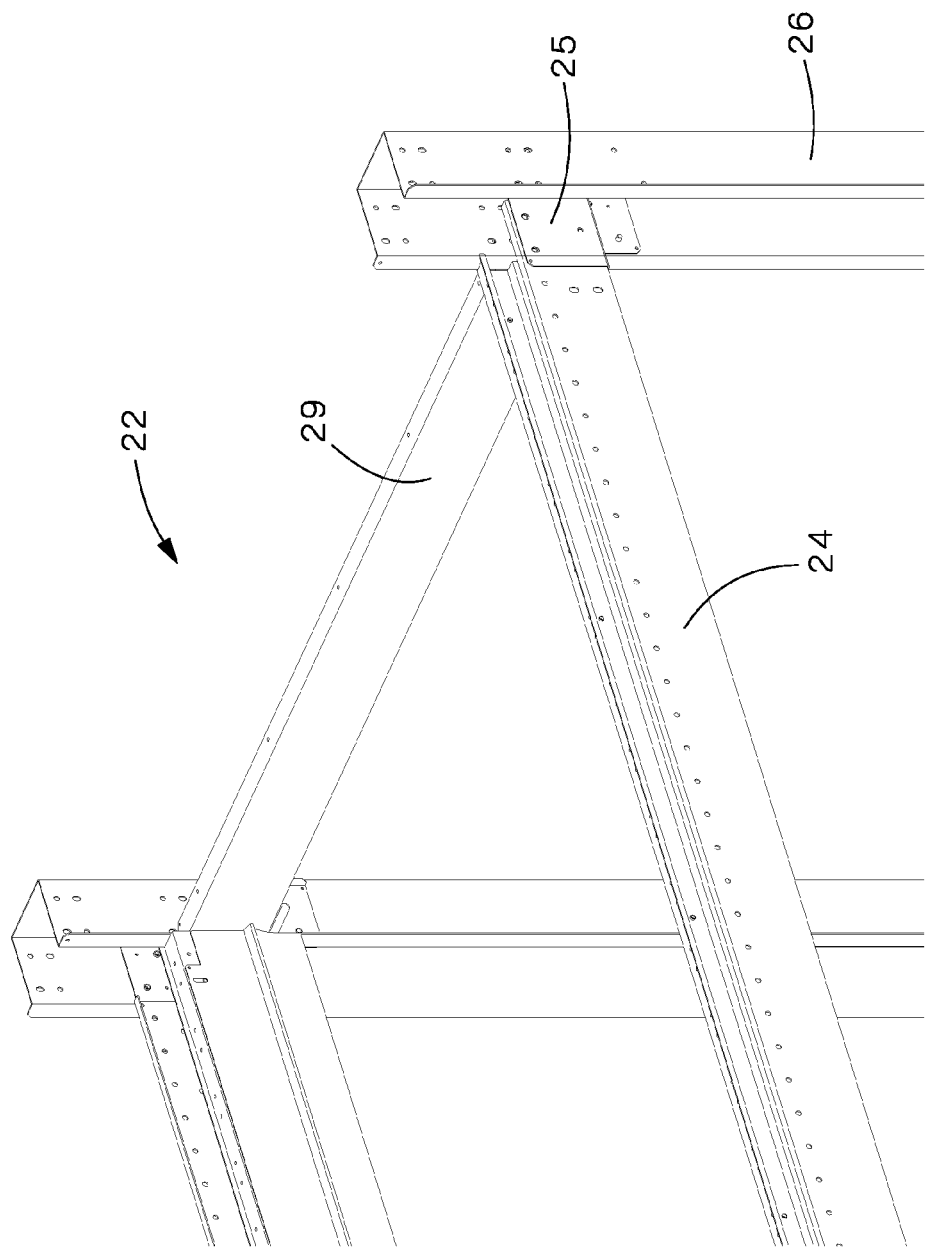
FIG. 3 is a perspective view of the corners of one end of the frame of the aisle containment system of FIG. 2.
Figure 4:
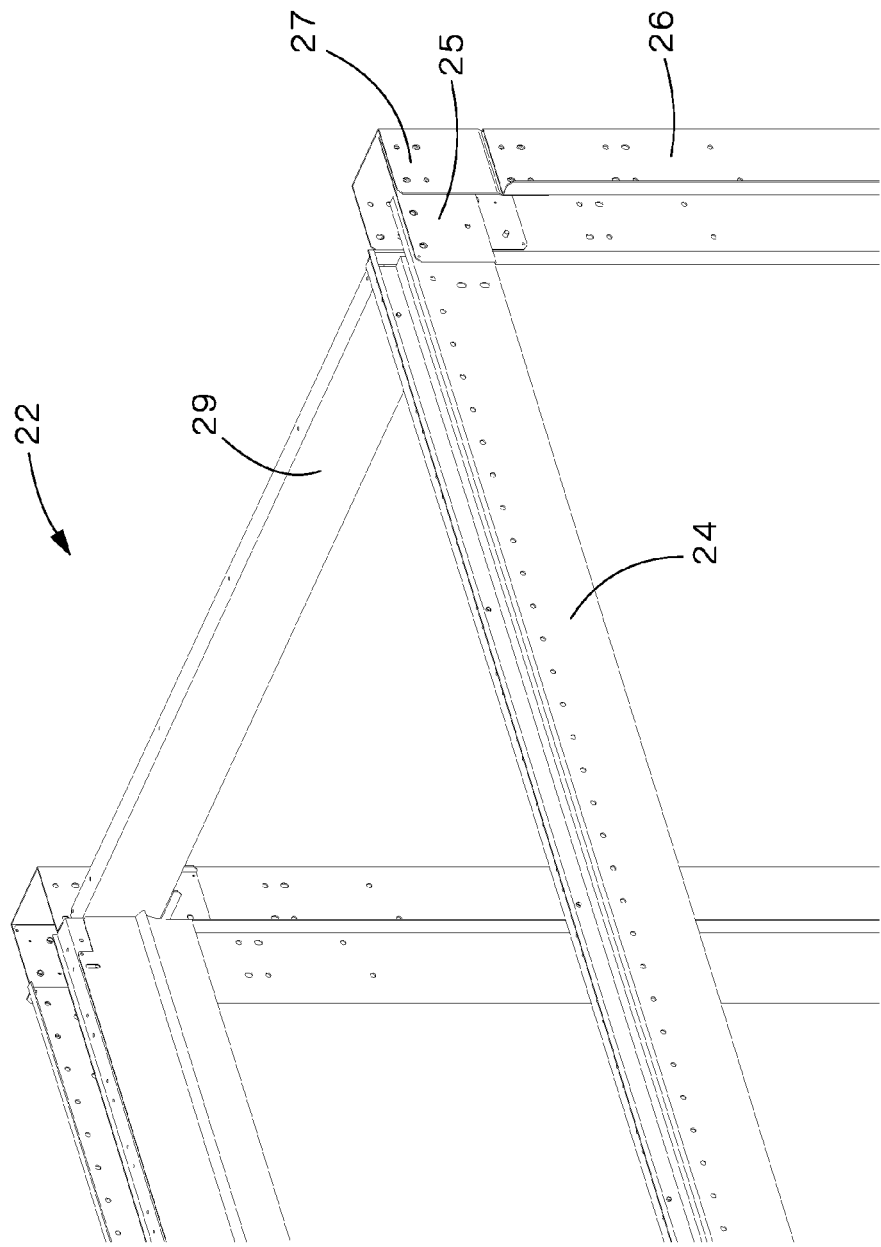
FIG. 4 is a perspective view of the corners of one end of the frame of the aisle containment system of FIG. 2 with post extending brackets.
Figure 5:
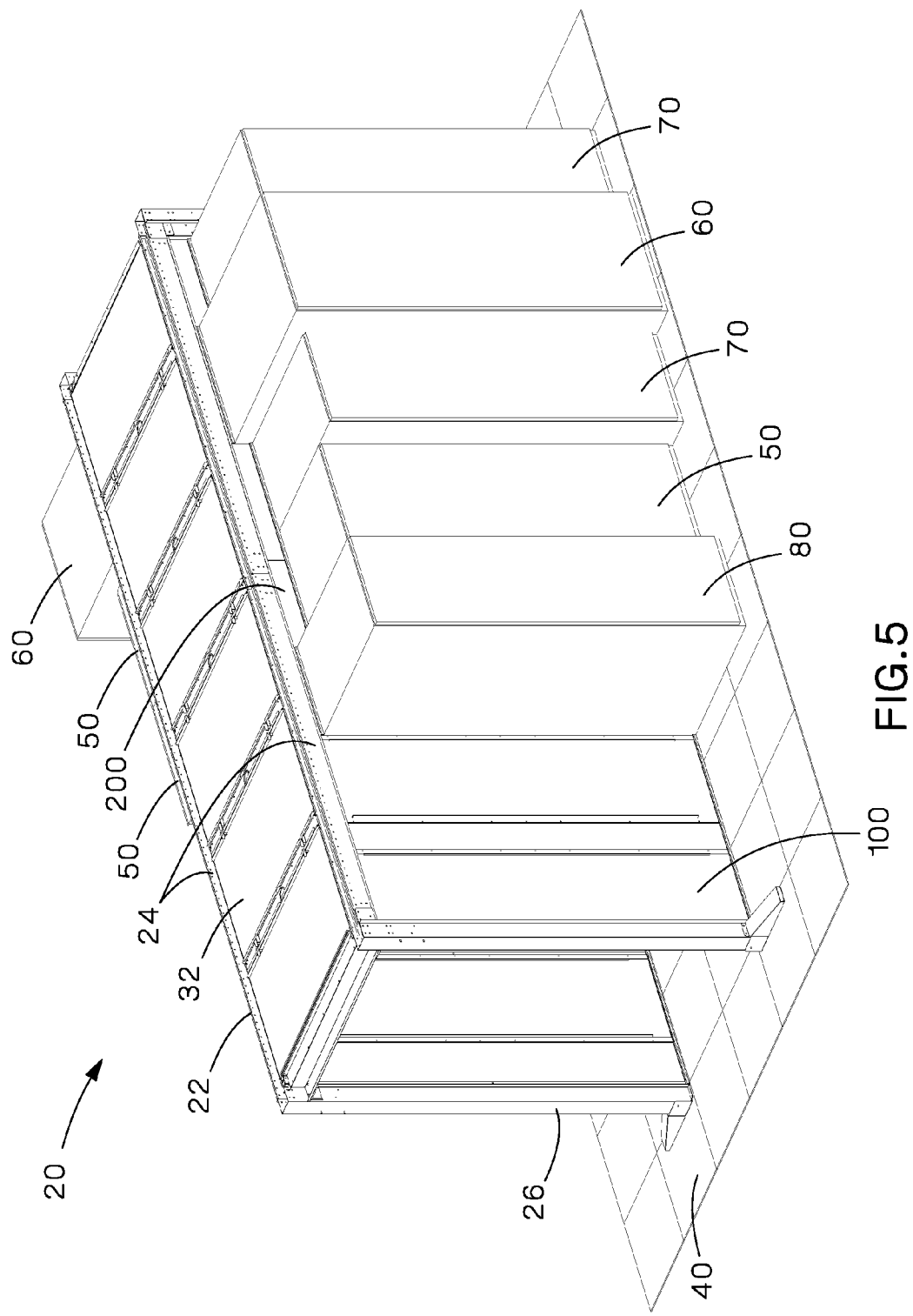
FIG. 5 is a perspective view of the independent aisle containment system of FIG. 1 with the sliding doors and header panels removed.
Figure 6:
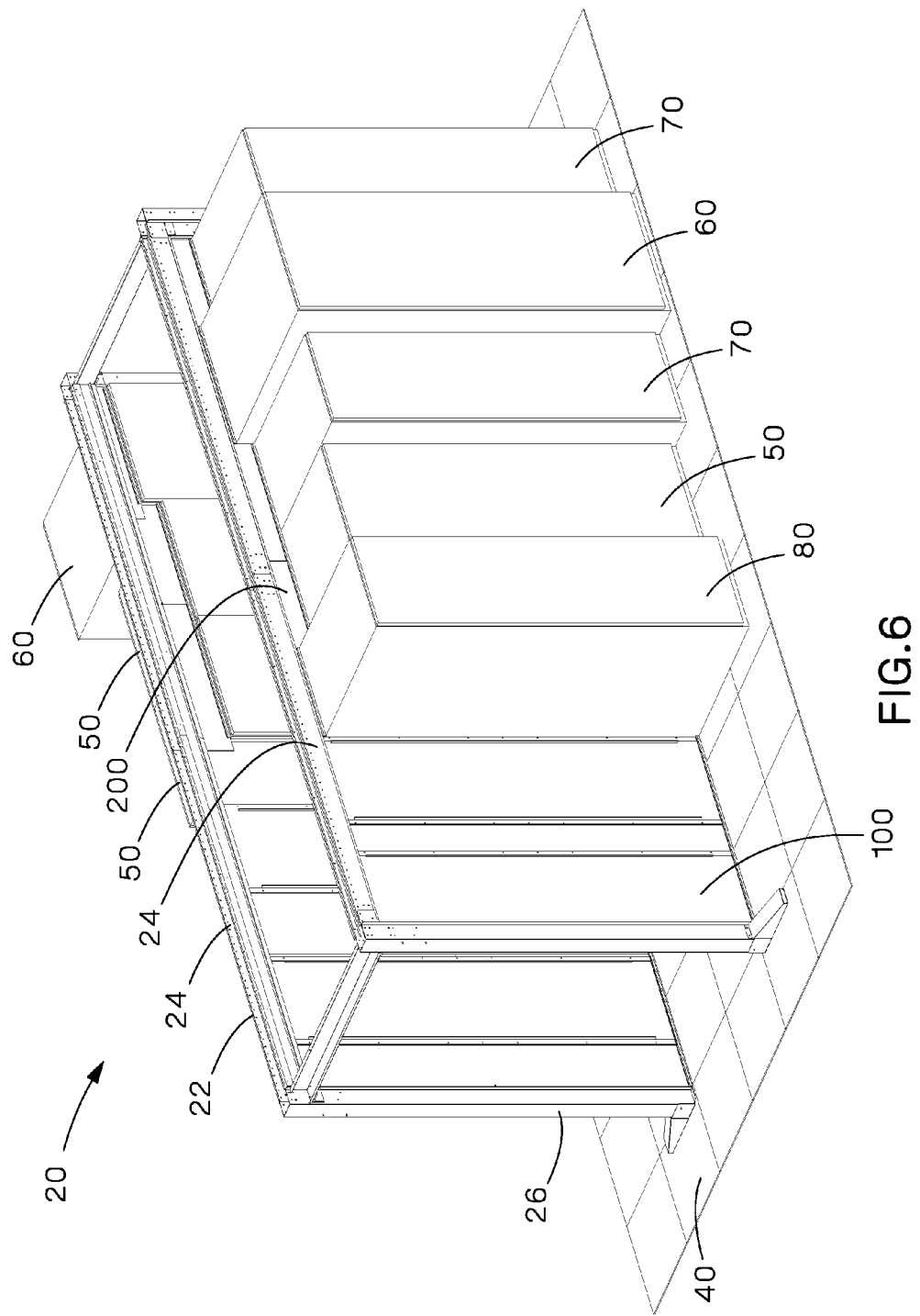
FIG. 6 is a right side perspective view of the independent aisle containment system of FIG. 5 with the ceiling panels removed.
Figure 7:
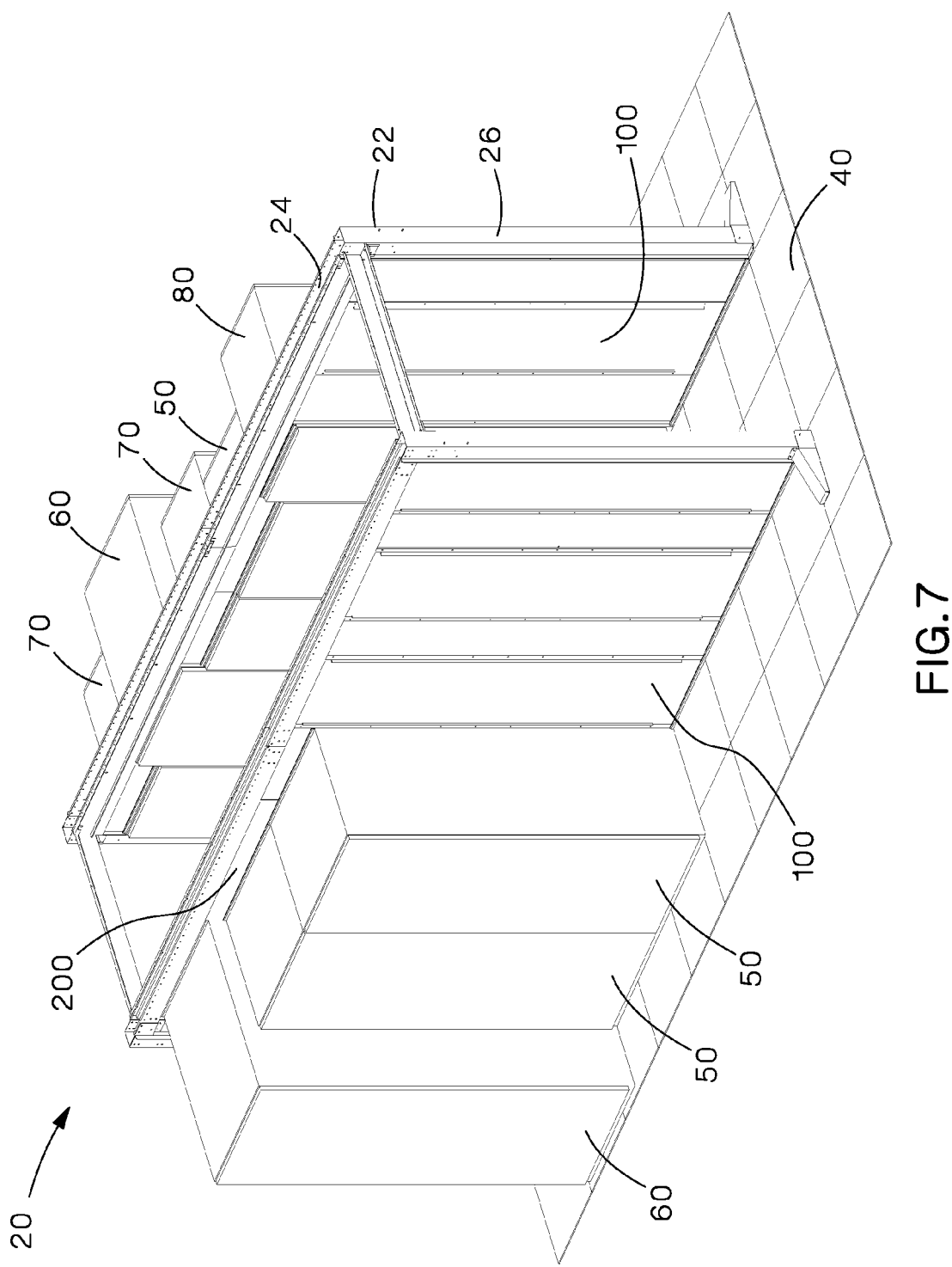
FIG. 7 is a left side perspective view of the independent aisle containment system of FIG. 5 with the ceiling panels removed.
Figure 8:
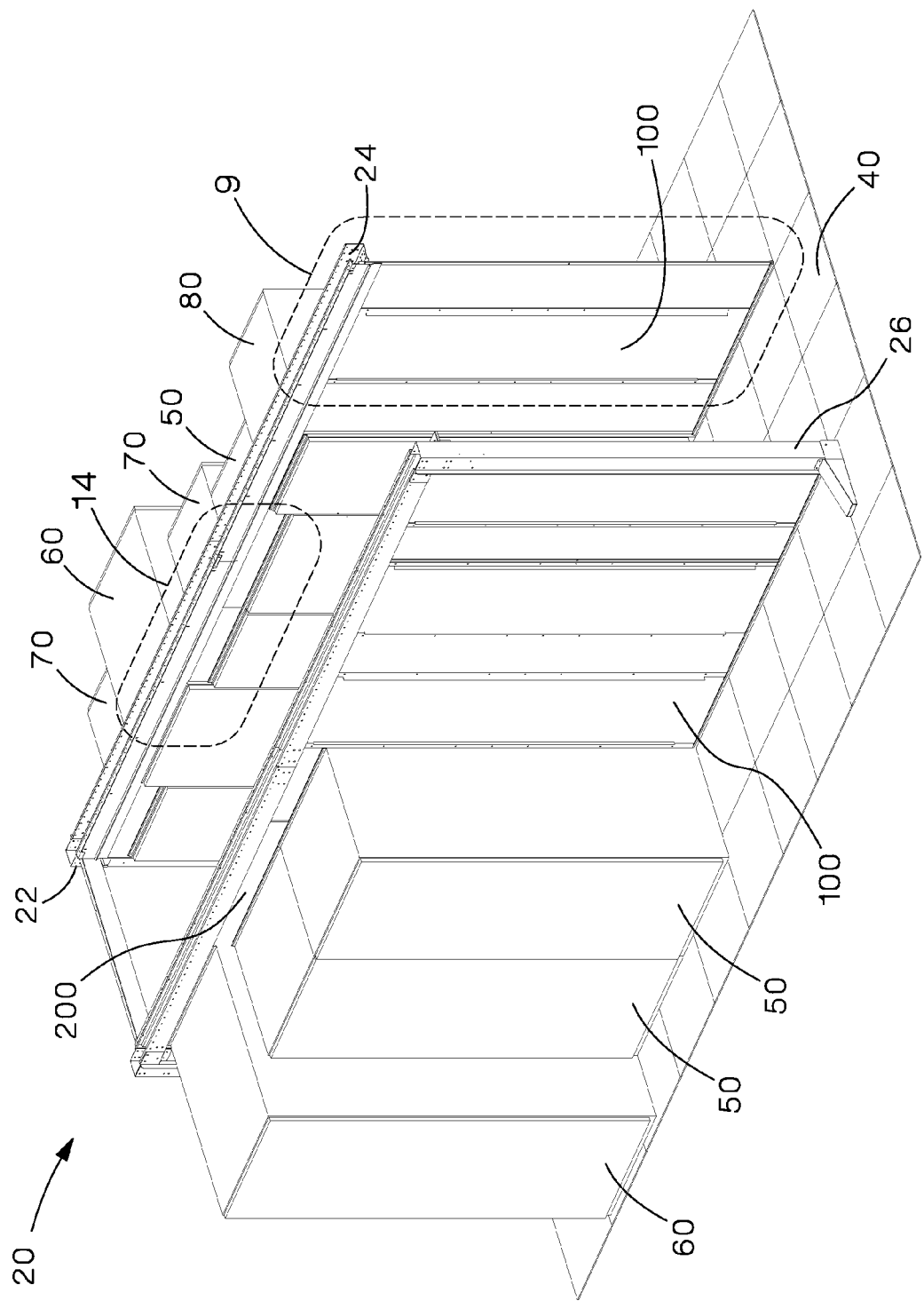
FIG. 8 is a left side perspective view of the independent aisle containment system of FIG. 7 with part of the frame removed.

The containment system 20 includes a frame 22 with wall beams 24, posts 26, a sliding door system 28 with a header panel 30, and ceiling panels 32. FIGS. 2-4 illustrate the frame 22 of the containment system 20 before cabinets are installed. The frame includes two ends with posts 26, header frames 29 positioned between the posts 26, and two wall beams 24 positioned between the ends. As illustrated in FIG. 3, the wall beams attach to the posts via brackets 25. The brackets 25 can be mounted at two heights, for example 42 or 45 RU, to accommodate the height of the cabinets installed in the containment system. FIG. 4 illustrates the frame 22 with post extending brackets 27 that may be used if a taller structure, for example 48 or 52 RU, is required. Thus, the height of the containment system can be adjusted via the placement of the brackets 25 or 27. The width of the containment system can be adjusted by varying the length of the header frame 29.

As illustrated in FIGS. 9-13, the adjustable full height blanking panels 100 extend from the floor 40 to the wall beam 24 of the containment system 20. The full height blanking panels 100 include a top 102, a bottom 104, a first side or edge 106 and a second side or edge 108. Each full height blanking panel 100 is constructed of translucent corrugated plastic or sheet metal. The full height blanking panels 100 include a vertical stiffener or frame 110 positioned along each side 106, 108 of the panel 100. The vertical stiffeners 110 are secured to the full height blanking panels 100 by fasteners 114, such as a bolt or rivet. The vertical stiffeners 110 extend the entire height of the full height blanking panels 100. Each vertical stiffener 110 includes an outwardly extending flange 112 that acts as a handle for positioning the full height blanking panels 100. The full height blanking panels 100 are installed in the containment system 20 such that the outwardly extending flanges 112 of adjacent full height blanking panels 100 extend in opposite directions (see FIGS. 11A-C).

Figure 9:
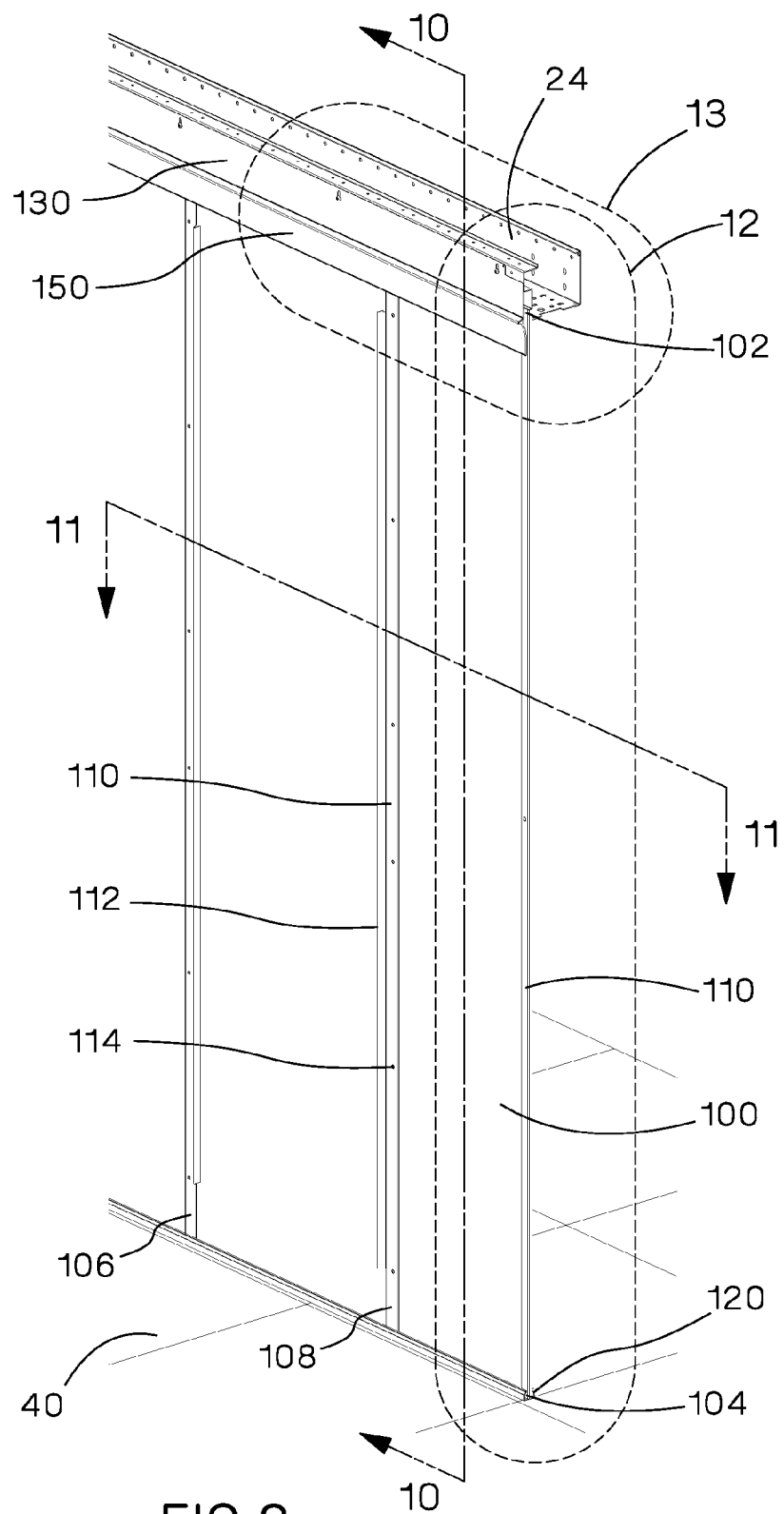
FIG. 9 is a detailed perspective view of adjacent full height blanking panels of the independent aisle containment system of FIG. 8.
Figure 10:
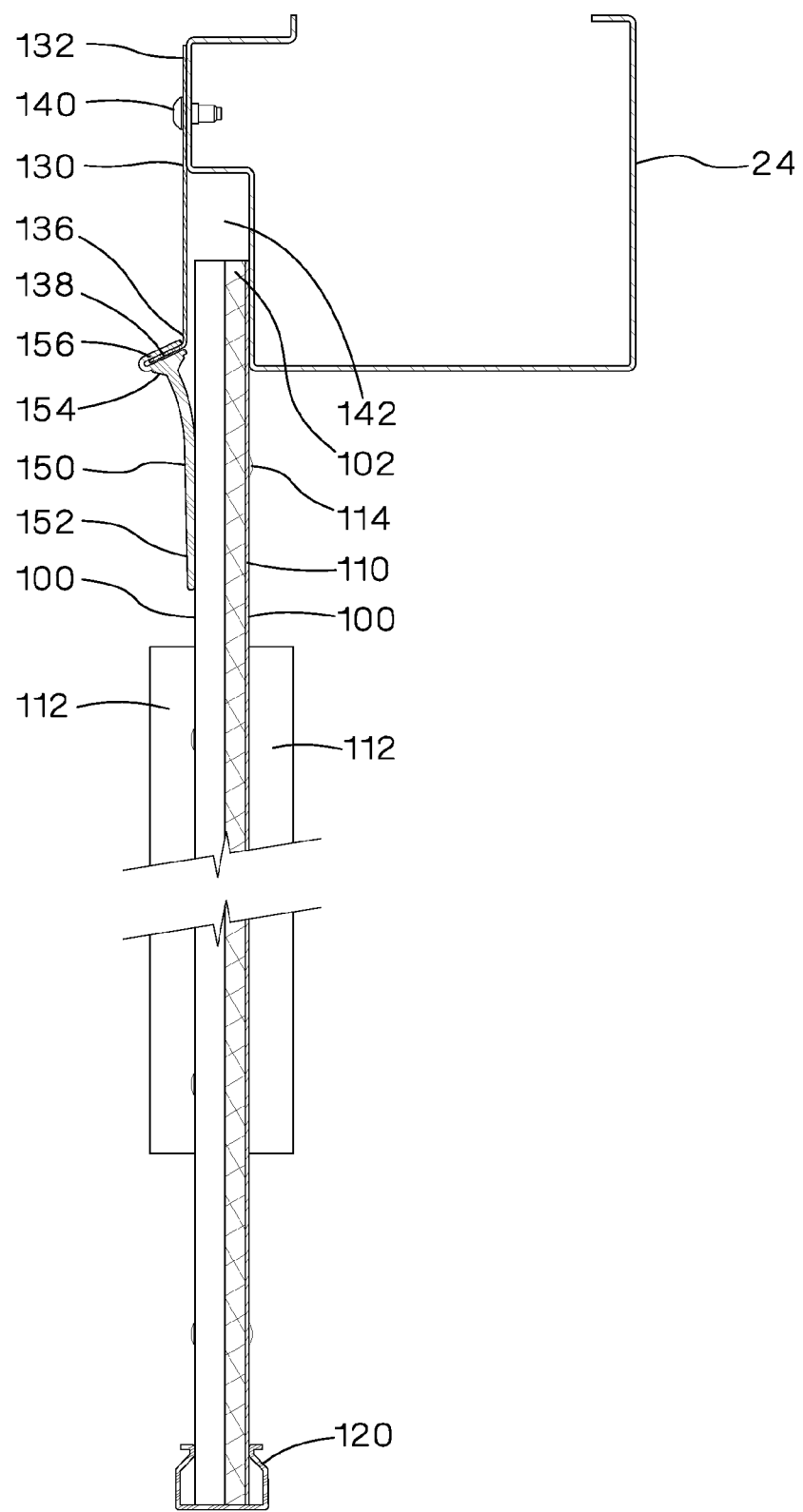
FIG. 10 is a cross sectional view of the full height blanking panels and the wall beam taken along line 10-10 of FIG. 9.
Figure 11A:
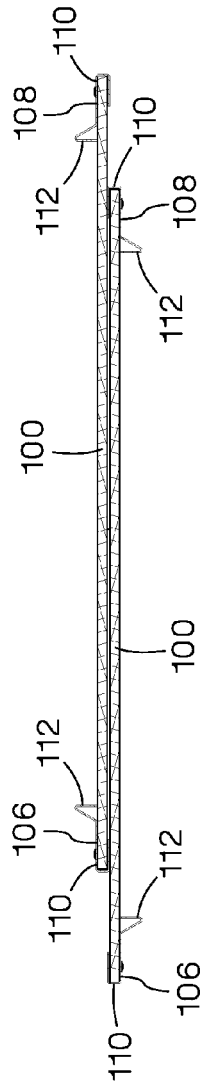
FIG. 11A is a cross sectional view of the full height blanking panels of FIG. 9 taken along line 11-11 adjusted to illustrate a minimum width.
Figure 11B:
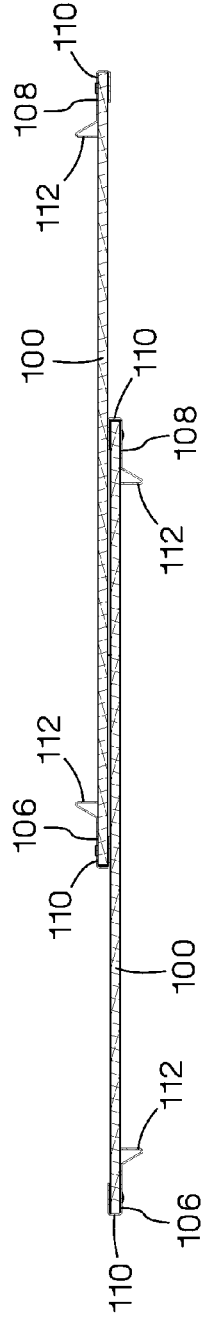
FIG. 11B is a cross sectional view of the full height blanking panels of FIG. 9 taken along line 11-11.
Figure 11C:
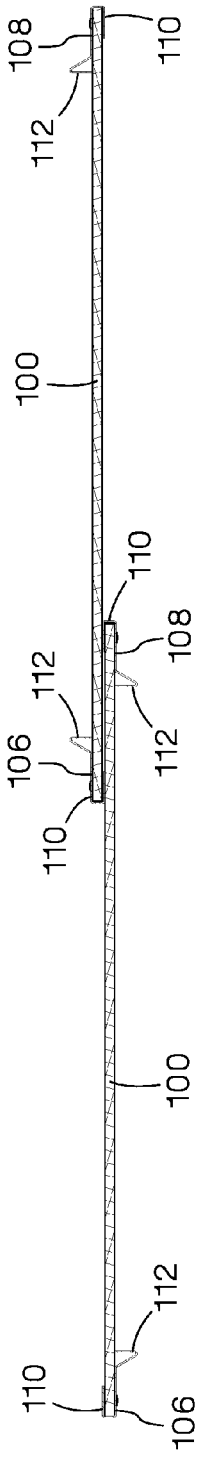
FIG. 11C is a cross sectional view of the full height blanking panels of FIG. 9 taken along line 11-11 adjusted to illustrate a maximum width.

As illustrated in FIGS. 9 and 10, a channel 120 or track is secured to the floor 40 of the data center. The width of the channel 120 is designed to accommodate two full height blanking panels 100 that are positioned adjacent each other. The bottoms 104 of the full height blanking panels 100 are positioned within the channel 120 and are free to slide with respect to each other. Thus, as illustrated in FIGS. 11A-C, the full height blanking panels 100 slide with respect to each other to fill the open space in the containment system 20. FIG. 11B illustrates a cross sectional view of the adjacent full height blanking panels 100 of FIG. 9.

FIG. 11A illustrates a minimum width that adjacent full height blanking panels 100 could provide with the vertical stiffeners 110 along each side 106, 108 of the full height blanking panels 100 positioned adjacent each other. FIG. 11C illustrates a maximum width that adjacent full height blanking panels 100 could provide with the vertical stiffeners 110 positioned along opposite sides 106, 108 of adjacent full height blanking panels 100 positioned adjacent each other.

Figure 12:
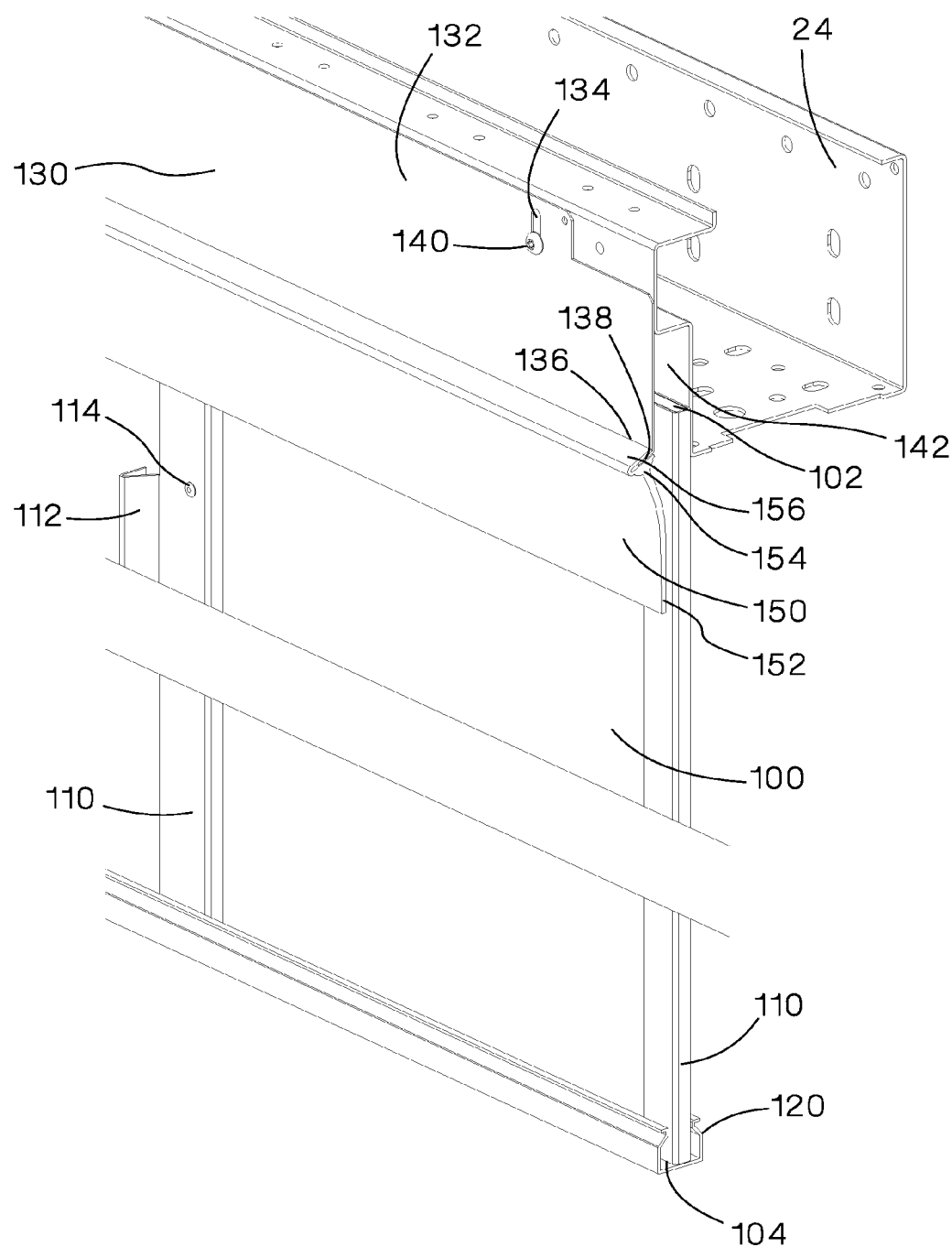
FIG. 12 is a partial detailed perspective view of the full height blanking panels secured to the wall beam of FIG. 9.
Figure 13:
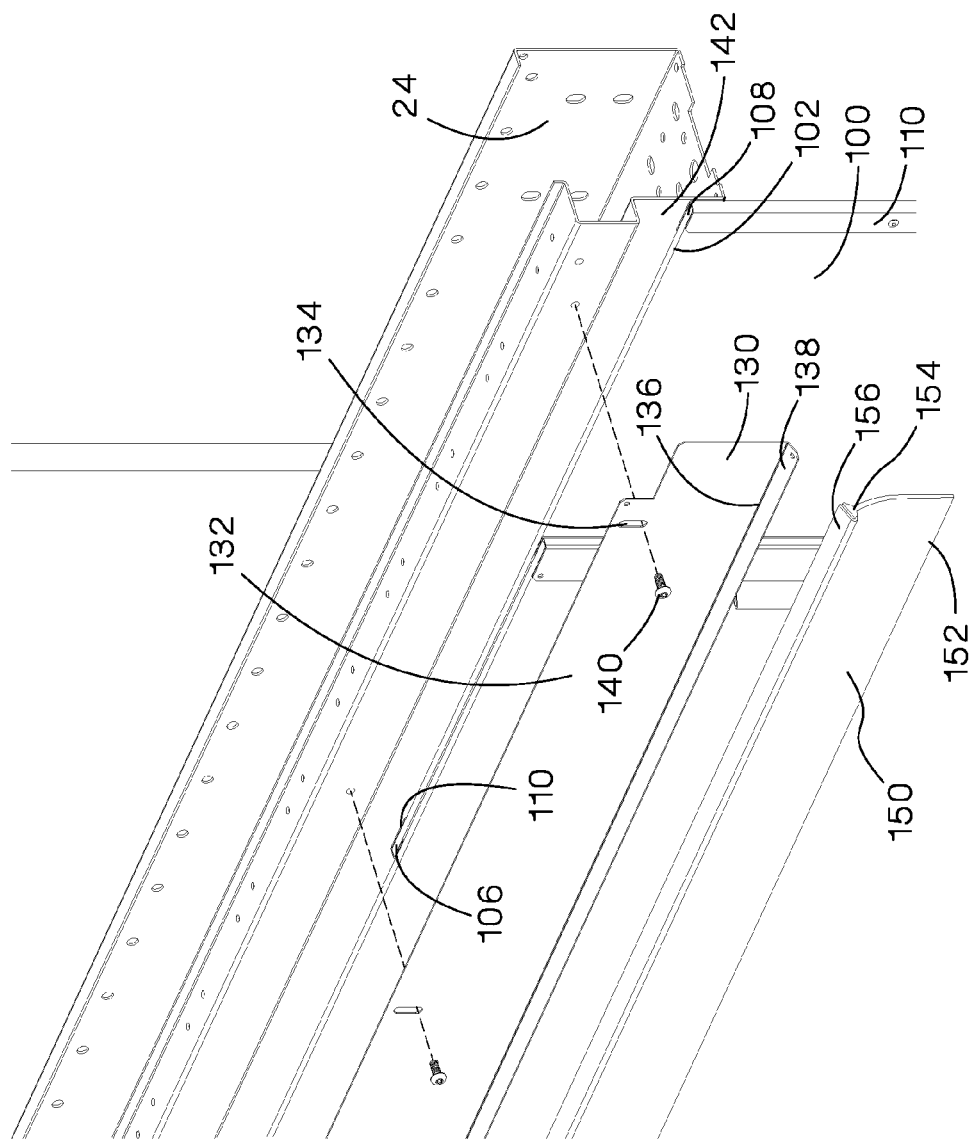
FIG. 13 is an exploded view of the panel clamp, full height blanking panels and wall beam of FIG. 9.

FIGS. 10, 12, and 13 illustrate detailed views of the wall beam 24, a panel clamp 130, a flap seal 150 and full height blanking panels 100. The panel clamp 130 is secured to the wall beam 24 of the containment system 20 via fasteners 140, such as bolts. The panel clamp 130 includes a first end 132 with elongated openings 134 for receiving the fasteners 140 and a second end 136 with an angled flange 138. The angled flange 138 is designed to receive the flap seal 150, as discussed below.

As illustrated in FIGS. 10 and 12, the staggered blanking panels 100 slide up into a slot 142 between the wall beam 24 and the panel clamp 130.

A flap seal 150 seals any openings between the full height blanking panels 100 and the panel clamp 130. The flap seals 150 also prevent the blanking panels 100, 200 from rattling when installed in the containment system 20. Each flap seal 150 is a rubber piece with a first free end 152 and a second end 154. The second end 154 of the flap seal 150 includes a U-shaped channel 156 that is configured to receive the flange 138 at the second end 136 of the panel clamp 130. As illustrated in FIGS. 10 and 12, the flap seal 150 slides onto the flange 138 at the second end 136 of the panel clamp 130 to secure the flap seal 150 to the panel clamp 130. As a result, the openings between the full height blanking panels 100 and wall beams 24 in the containment system 20 are sealed.

Figure 14:
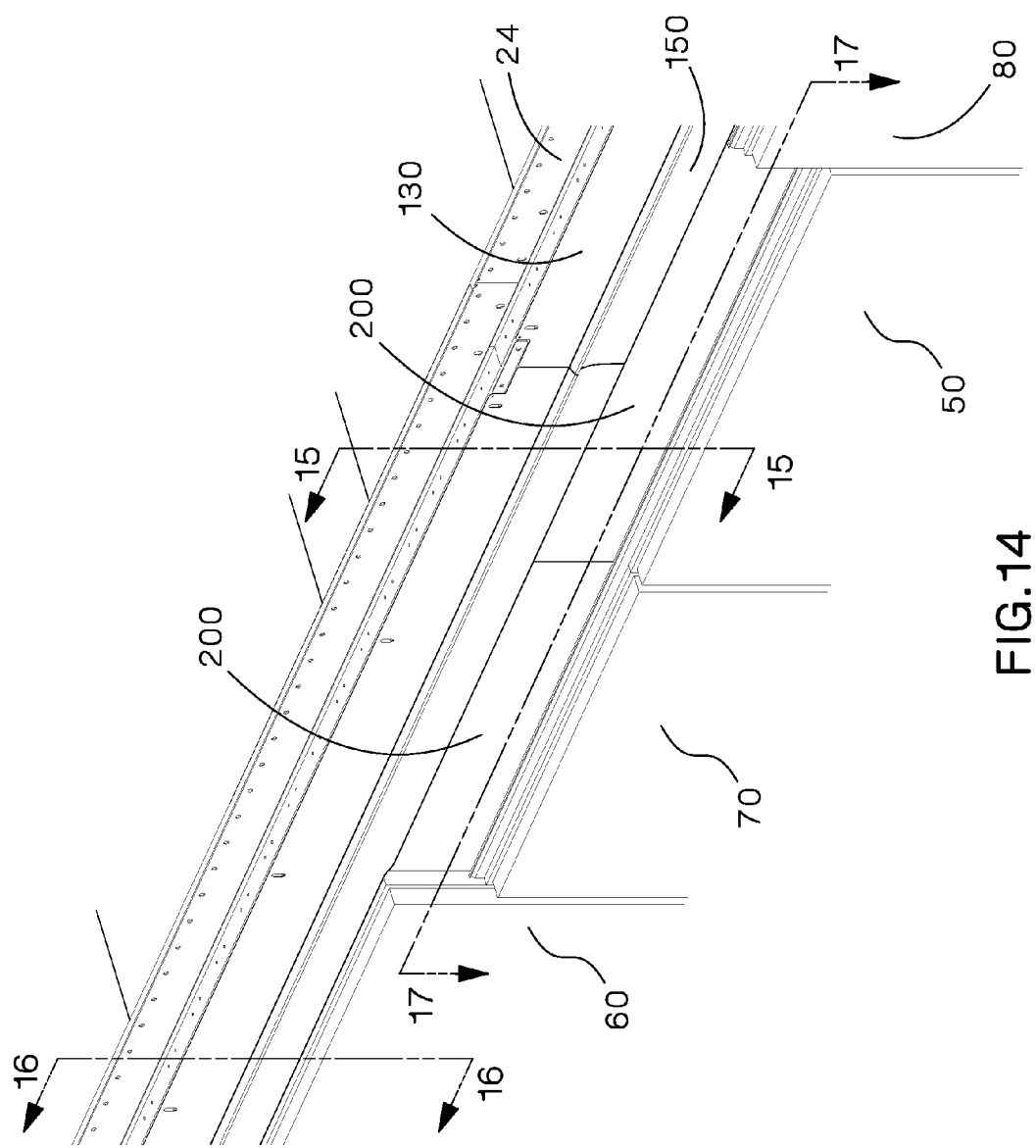
FIG. 14 is a detailed perspective view of the above cabinet blanking panels of the independent aisle containment system of FIG. 8.
Figure 15:
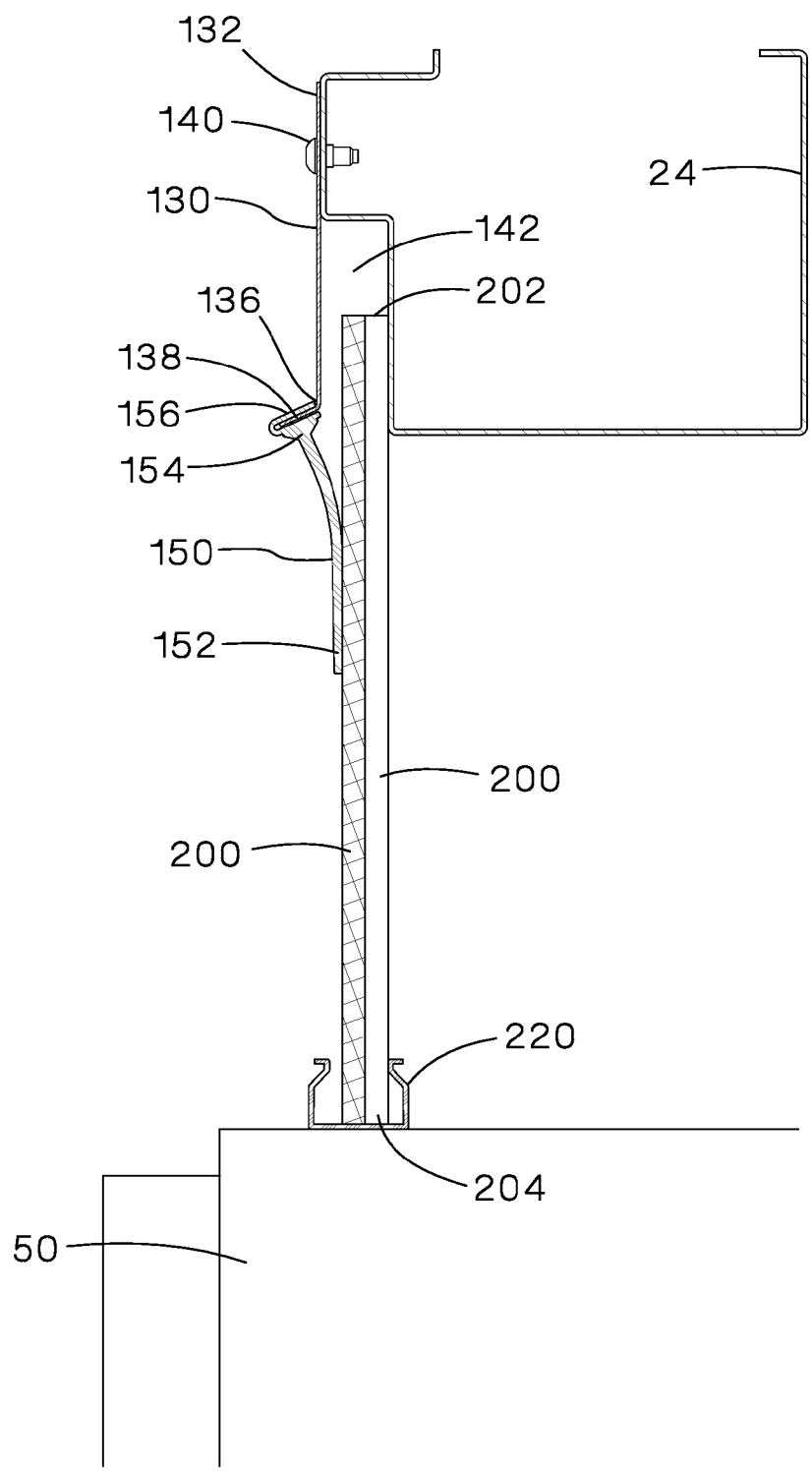
FIG. 15 is a cross sectional view of the above cabinet blanking panels of FIG. 14 taken along line 15-15.
Figure 16:
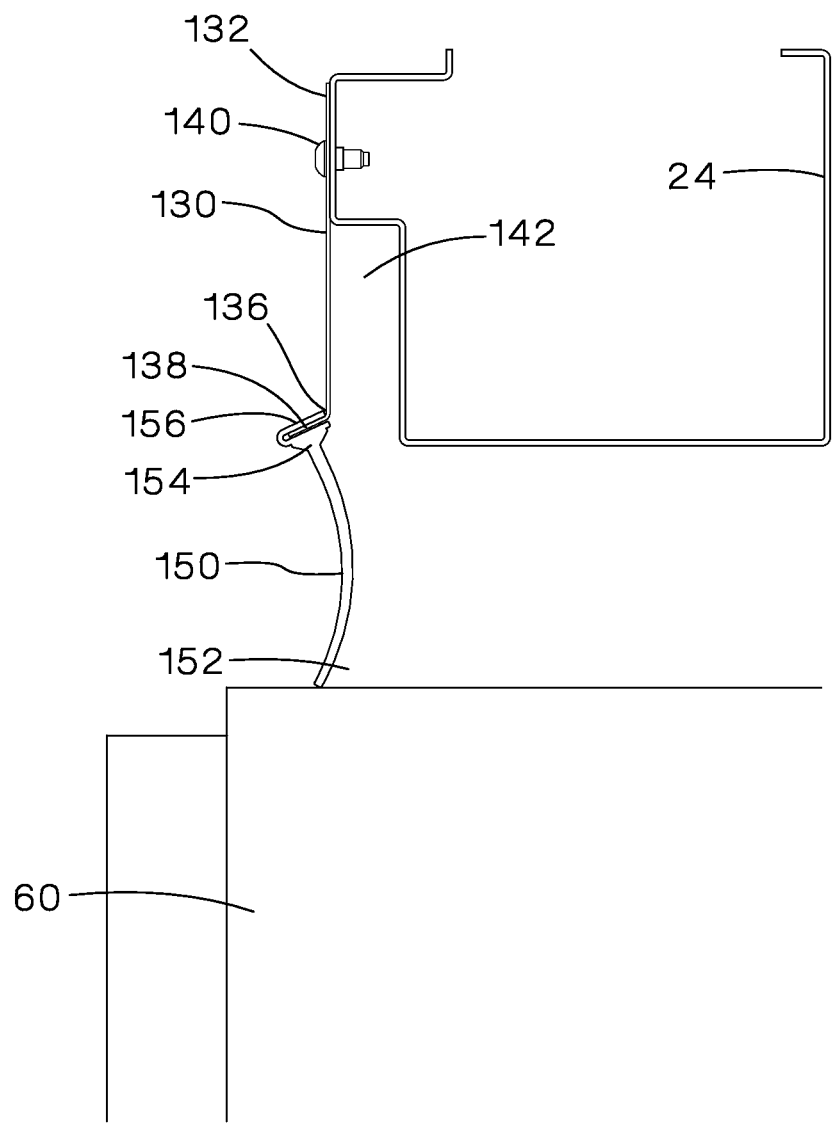
FIG. 16 is a cross sectional view of the full height cabinet of FIG. 14 taken along line 16-16.

FIGS. 14 and 16 illustrate cabinet 60 and the flap seal 150 touching the top of the cabinet to create a seal. As discussed above, the height of the frame in the containment system is based on the tallest cabinet installed in the containment system. Adjustable above cabinet blanking panels 200 are used with cabinets 50 and 70 that have a height less than the height of the frame and the height of the tallest cabinet in the containment system. The adjustable above cabinet blanking panels 200 are illustrated in FIGS. 14-15 and 17. The above cabinet blanking panels 200 include a top 202, a bottom 204, a first side 206 and a second side 208. The above cabinet blanking panels 200 are made from a translucent corrugated plastic. The above cabinet blanking panels 200 are shorter panels compared to the full height blanking panels 100 and therefore do not require vertical stiffeners.

As illustrated in FIG. 15, a channel 220 is secured to the top of the cabinets 50 and 70 for receiving the bottom 204 of the above cabinet blanking panels 200. The width of the channel 220 is designed to receive two above cabinet blanking panels 200 that are positioned adjacent each other.

FIG. 17B illustrates a cross sectional view of the adjacent above cabinet blanking panels 200 of FIG. 14. The panels 200 are slid in the channel 220 until they are positioned to engage the cabinet 60, 80 on either side to fill the open space between the cabinets 50, 70 and the wall beam 24. FIG. 17A illustrates a cross sectional view of two above cabinet blanking panels 200 adjusted to expand a minimum width between cabinets. FIG. 17C illustrates a cross sectional view of two above cabinet blanking panels 200 adjusted to expand to a maximum width between cabinets.

During installation, after the specific height of the open space is determined, the above cabinet blanking panels 200 are cut with a knife, or other device, to a height that accommodates the open space. As illustrated in FIG. 15, the above cabinet blanking panels 200 slide between the panel clamp 130 and the wall beam 24 similar to the full height blanking panels 100 illustrated in FIGS. 10-13. The panel clamp 130 and flap seal 150 seal any opening between the above cabinet blanking panels 200 and the wall beams 24.

Figure 18:
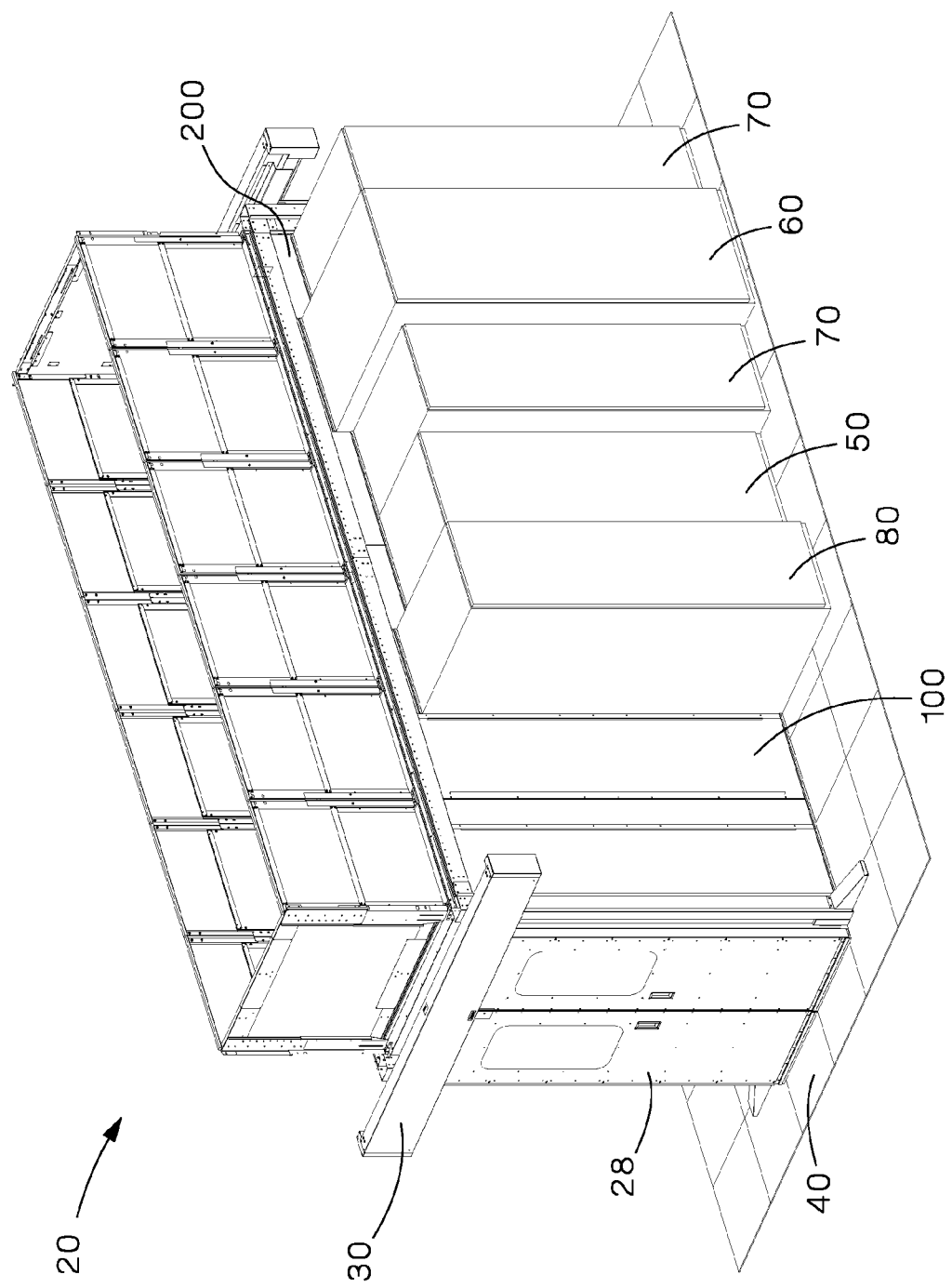
FIG. 18 is a perspective view of the independent aisle containment system of the present invention configured for hot aisle containment.

FIG. 18 illustrates the independent aisle containment system of the present invention used with a hot aisle configuration. The full height blanking panels 100 and the above cabinet blanking panels 200 can be adjusted as described above to seal the open areas defined by the existing cabinets installed in the containment system.

The independent aisle containment system of the present invention is versatile as the system may be adapted for the needs of the individual users. The independent aisle containment system can be used with cabinets of different width, height, depth, or manufacturer. The independent aisle containment system can be installed at different heights, with different aisle widths in either a hot or cold aisle configuration. The independent aisle containment system may be installed on a raised floor or a concrete floor. The independent aisle containment system may also be constructed around rows of cabinets in an existing data center.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

The invention claimed is:
1. An aisle containment system comprising:
a frame positioned on a floor, the frame defined by wall beams, header frames, and a plurality of posts secured to the wall beams and header frames, wherein the header frames extend a width of the frame and the wall beams extend a length of the frame;

a plurality of blanking panels extending from the floor to one of the wall beams, the plurality of blanking panels having a top, a bottom, a first side and a second side; and vertical stiffeners positioned along at least one of the first side and the second side of each blanking panel;

wherein each blanking panel overlaps adjacent blanking panels along the length of the frame and the blanking panels are laterally adjusted to fill openings in the aisle containment system;

a panel clamp secured to one of the wall beams, wherein the panel clamp has a first end with openings for receiving a fastener to secure the panel clamp to one of the wall beams and a second end;

wherein the panel clamp defines a slot between one of the wall beams and the panel clamp for receiving the blanking panels; and wherein the second end of the panel clamp has an angled flange, the angled flange receives a flap seal to seal openings between the blanking panels and the panel clamp in the aisle containment system.

2. The aisle containment system of claim 1, wherein each vertical stiffener having an outwardly extending flange for providing a handle to adjust the blanking panel.

3. The aisle containment system of claim 2, wherein the outwardly extending flanges of adjacent blanking panels extend in opposite directions.

4. The aisle containment system of claim 1, wherein the vertical stiffeners are positioned along the first side and the second side of each blanking panel.

5. The aisle containment system of claim 1, further comprising a floor channel positioned on the floor under the wall beams, wherein the bottom of each blanking panel is positioned within the floor channel, whereby adjacent blanking panels slide in the floor channel with respect to each other.

6. The aisle containment system of claim 1, wherein the flap seal having a first free end and a second end, the second end including a channel that receives the angled flange at the second end of the panel clamp.

7. The aisle containment system of claim 1, further comprising a plurality of cabinets installed under the wall beams in the aisle containment system and a plurality of adjustable above cabinet blanking panels installed above the plurality of cabinets for filling any openings between the wall beams and the cabinets.

8. The aisle containment system of claim 7, wherein each above cabinet blanking panel having a top, a bottom, a first side, and a second side; wherein a cabinet channel is secured to the top of at least one cabinet for receiving the bottom of the above cabinet blanking panels.

9. The aisle containment system of claim 8, wherein each above cabinet blanking panel overlaps adjacent above cabinet blanking panels, the above cabinet blanking panels slide in the cabinet channel with respect to each other to fill any open space between cabinets and the wall beam.

10. The aisle containment system of claim 1, further comprising ceiling panels extending between the wall beams.

11. An aisle containment system comprising:

a frame having a first end and a second end, two posts positioned at each of the first end and the second end, header frames extending a width of the frame and wall beams extending a length of the frame, wherein the header frames and the wall beams are secured to the posts;

a plurality of cabinets positioned within the frame; and a plurality of blanking panels positioned adjacent the cabinets for filling openings in the aisle containment system, wherein the blanking panels extend from a floor to one of the wall beams, the blanking panels having a top, a bottom, a first side and a second side; vertical stiffeners are positioned along at least one of the first side and the second side of each blanking panel, wherein each blanking panel overlaps adjacent blanking panels, and the blanking panels are laterally adjusted to fill openings in the aisle containment system;

a panel clamp secured to one of the wall beams, wherein the panel clamp has a first end with openings for receiving a fastener to secure the panel clamp to one of the wall beams and a second end;

wherein the secured panel clamp defines a slot between one of the wall beams and the panel clamp for receiving the blanking panels;

wherein the second end of the panel clamp has an angled flange, the angled flange receives a flap seal to seal openings between the blanking panels and the panel clamp in the aisle containment system.

12. The aisle containment system of claim 11, wherein each vertical stiffener having an outwardly extending flange for providing a handle to adjust the blanking panel, the outwardly extending flanges of adjacent blanking panels extend in opposite directions.

13. The aisle containment system of claim 11, wherein the vertical stiffeners are positioned along the first side and the second side of each blanking panel.

14. The aisle containment system of claim 11, further comprising a floor channel positioned on the floor under the wall beams, wherein the bottom of each blanking panel is positioned within the floor channel, whereby adjacent blanking panels slide in the floor channel with respect to each other.

15. The aisle containment system of claim 11, wherein the flap seal having a first free end and a second end, the second end including a channel that receives the angled flange at the second end of the panel clamp.

16. The aisle containment system of claim 11, further comprising a plurality of adjustable above cabinet blanking panels installed above the plurality of cabinets for filling any openings between the wall beams and the cabinets.

17. The aisle containment system of claim 16, wherein each above cabinet blanking panel having a top, a bottom, a first side, and a second side; wherein a cabinet channel is secured to the top of at least one cabinet for receiving the bottom of above cabinet blanking panels, wherein each above cabinet blanking panel overlaps adjacent above cabinet blanking panels, the above cabinet blanking panels slide in the cabinet channel with respect to each other to fill any open space between cabinets and the wall beam.

18. The aisle containment system of claim 11, further comprising ceiling panels extending between the wall beams.

\* \* \* \* \*